July 9, 1968 A. F. MULLINS 3,392,343

LOW NOISE AMPLIFIERS

Filed June 10, 1965 2 Sheets-Sheet 1

United States Patent Office 3,392,343
Patented July 9, 1968

3,392,343

LOW NOISE AMPLIFIERS

Alden F. Mullins, Elkins Park, Pa., assignor to Leeds & Northrup Company, a corporation of Pennsylvania Filed June 10, 1965, Ser. No. 462,952
5 Claims. (Cl. 330—24)

ABSTRACT OF THE DISCLOSURE

A low noise, high gain, small input signal amplifier including a common emitter input junction transistor coupled to a high input impedance common source field effect transistor and a load coupled to the drain of the field effect transistor. The junction transistor is to have a substantially optimum value of source impedance while its output impedance provides substantially optimum low noise conditions for the field effect transistor. The high input impedance of the field effect transistor does not adversely load the output of the junction transistor. Thus the amplifier operates with high gain and low noise.

This invention relates to amplifiers utilizing solid state circuitry and more particularly, to an amplifier which provides high voltage gain for low level signals with the introduction of a minimum of noise.

In many applications, it is necessary to provide a high voltage gain for low level signals which originate in a low impedance source. For example, it is often necessary to provide amplification for the outputs of thermocouples or strain gauges which are low impedance devices and which produce low level signals.

Prior art attempts to obtain a high gain with low noise for small signals from such devices have not been satisfactory under all circumstances. While vacuum tube and transformer circuits have been employed for this purpose, it is undesirable to utilize vacuum tubes in equipment which is otherwise completely transistorized. This is for the reason that when vacuum tubes are employed it is necessary to provide the high plate voltages and heater currents. Furthermore, the heat dissipation from vacuum tubes is undesirable in miniaturized equipment and the use of vacuum tubes is contrary to the trend toward miniaturization of all circuits. Furthermore, in such circuits a transformer having a high voltage step-up must be used. Such high step-up transformers are quite bulky and undesirable in miniaturized circuits.

Prior art attempts to utilize transistor circuits for high gain amplification of small signals from a low impedance source have not been completely successful. This is for the reason that prior art transistor circuits introduce a high level of noise which is incompatible with the low level signals which it is desired to amplify.

Accordingly, one object of the present invention is to provide an amplifier employing solid state circuitry and which provides a high gain for low level input signals from a source which inherently has a low impedance.

A further object of this invention is to provide an amplifier having the capability to drive a low impedance output load with a greatly amplified signal from a low level source of the type previously described.

These and other objects are achieved in accordance with this invention by providing an input transistor of the low current high gain type. These transistors have operating characteristics such that low noise is introduced when the source impedance presented to the transistor is of a low value common in sources of the type which produce the low level signals which are to be amplified by the present amplifier. The input transistor is operated at a low value of collector current to further insure low noise operation. In order to provide high gain in the input transistor at such low collector current, a high resistance collector resistor is utilized. The signal at the collector of the input transistor is applied to the gate of a field effect transistor. The source impedance presented by the input transistor and its collector resistor is an optimum value of source impedance for operation of the field effect transistor in a low noise mode of operation. The output taken at the drain of the field effect transistor has a high amplitude which is no longer susceptible to the introduction of spurious noise and the output can be used to drive a load of any desired impedance.

Further objects, features and advantages of the present invention will be better understood from the following more detailed description taken in conjunction with the claims and drawings in which:

Figure 1:
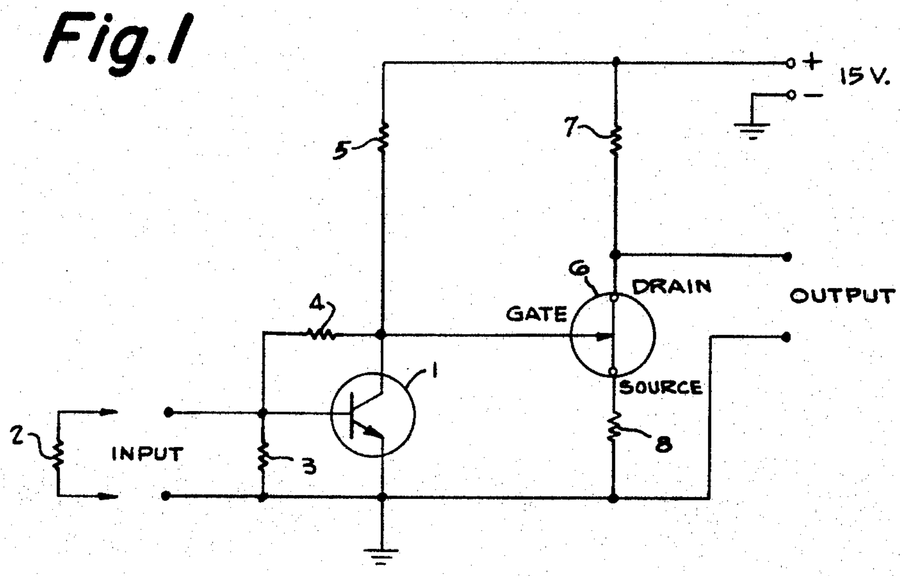
FIG. 1 shows a simplified schematic diagram of a direct coupled amplifier constructed in accordance with this invention.

Referring now to FIG. 1, there is shown a junction type input transistor 1. This junction transistor 1 is of the type which can provide a high gain with a low collector current. An example of a type of transistor suitable for this purpose is the 2N930 N-P-N planar silicon transistor. Low level signals from a source depicted at 2 are applied between the base and emitter of the input transistor 1. A resistor 3 is connected between the base and emitter and a resistor 4 is connected between the collector and base to provide bias for the input transistor 1. Of course, it will be appreciated that various other biasing arrangements may be provided.

The parallel combination of the source 2 together with resistor 3 determines the source impedance which is presented to the input transistor 1. The value of the resistor 3 is chosen such that the optimum source impedance is presented to the transistor 1 for operation of the transistor in a low noise condition.

Figure 3:
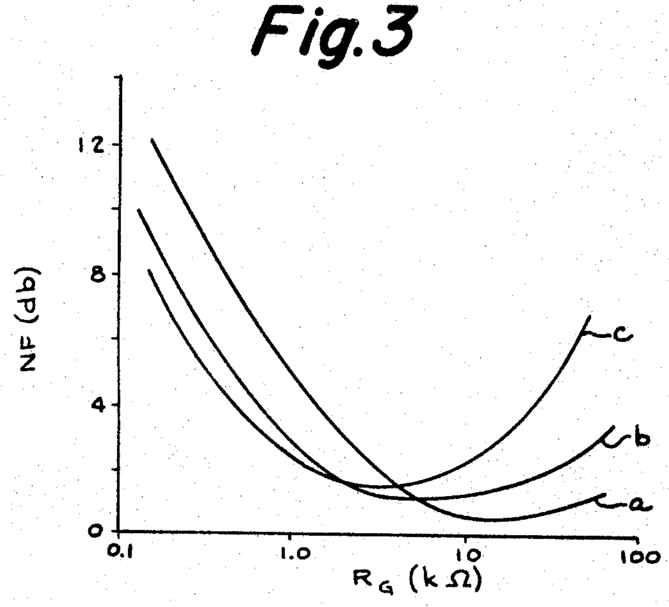
FIG. 3 shows curves depicting the source impedance versus noise characteristics for the input junction type transistor of this invention.

For example, referring to FIG. 3, there is shown typical operating curves for various collector currents of the input transistor. The curve *a* shows the source impedance $R_G$ versus noise figure, NF, for a collector current of, for example, 10 microamps. The curve *b* shows the source impedance versus noise figure for a collector current of 30 microamps and the curve *c* shows the source impedance versus noise figure for a collector current of 100 microamps. For the operating characteristics shown, it will be appreciated that a source impedance of approximately 10K ohms will be optimum so that the transistor 1 is operating with the introduction of a small amount of noise.

A collector resistor 5 is connected to the collector of input transistor 1. It will be appreciated that the collector current through input transistor 1 must be maintained at a low value, for example, 10 microamperes, to insure low noise operation. In order to produce a high gain with this low collector current, it is necessary that the resistor 5 have a high value. That is, when the collector current through the input transistor 1 is at a very low value, which is necessary to insure low noise, the value of the collector resistor 5 must be high so that the gain of the input transistor 1 will be high. This will insure that the low level input signal is amplified to a high level and it will not thereafter be deteriorated by noise.

The maximum gain for the input transistor 1 will be obtained if the resistance of resistor 5 approximately matches the small signal output impedance of input transistor 1. (For a more complete explanation of the small signal output impedance, see, for example, Semiconductor Devices and Applications, R. A. Greiner, McGraw-Hill, 1961, p. 237.)

Under the operating conditions set forth herein, the small signal output impedance is approximately the same as the dynamic collector resistance of the input transistor 1.

If the resistance of resistor 5 is less than the small signal output impedance of input transistor 1, the gain of input transistor 1 will be decreased. Of course, the resistance of resistor 5 can be greater than the small signal output impedance of input transistor 1 without adversely affecting the gain. However, this is undesirable because it may necessitate the use of an excessively high collector supply voltage in order to obtain the same collector current. Therefore, the optimum condition is that the resistance of resistor 5 is approximately equal to the small signal output impedance of input transistor 1.

With a low collector current transistor and a high value for the collector resistor 5, it is possible to achieve a gain for the amplifying stage in excess of 200.

This represents a marked improvement over prior art circuits, particularly those utilizing a vacuum tube and a transformer. It would not be possible to achieve such a large voltage step-up with a transformer without having such an excessive number of turns in the transformer as would make it bulky and impractical for use. That is, the input impedance of the transistor 1 is large compared to the source impedance presented to it and does not excessively drain current from the source, while at the same time it provides a large voltage gain for the input signal. If a transformer were used as the input device, then the open circuit impedance of the primary winding of the transformer would have to be large compared to the source impedance. Such an input transformer would of necessity have an impedance step-up ratio of only about 1:100 in order that the transformed 10K source impedance not exceed approximately 1 megohm for optimum low noise performance of the field effect transistor. Such a transformer will provide a voltage step-up of only 1:10 which is less by at least one order of magnitude than the gain provided by use of the input transistor 1 for this purpose. If a 1:100 voltage step-up transformer were contemplated, the transformed 10K source impedance would be 100 megohms and it would be necessary to achieve an open circuit secondary impedance considerably greater than this 100 megohms. It is not possible at the present time, for example, to achieve a transformer secondary impedance of more than 100 megohms at 60 cycles per second in a practical size.

A field effect type of transistor 6 provides the output stage for the amplifier. The collector of input transistor 1 is connected to the gate of the field effect transistor 6. The output of the field effect transistor, taken from the drain of the transistor, can be used to drive any load without concern for the magnitude of the load.

Figure 4:
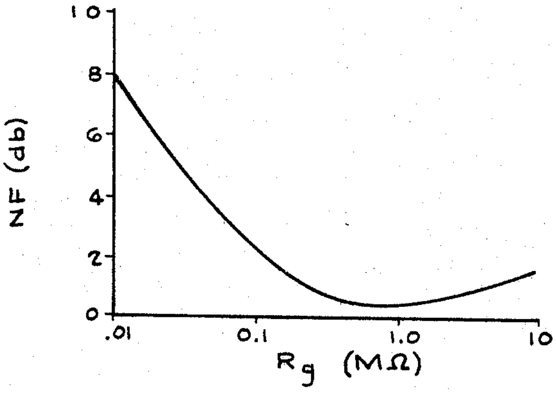
FIG. 4 shows the source impedance versus noise level characteristics of a field effect transistor utilized for the output transistor in accordance with the principles of this invention.

A field effect transistor of the type used in this circuit has the characteristics of source impedance versus noise level as is shown in FIG. 4. As will be seen with reference to FIG. 4, it is possible to operate the field effect transistor 6 at a very low noise level if the source impedance presented to the field effect transistor approximates 0.5 to 1.0 megohms.

In order to accomplish this, the parallel combination of the resistance of resistor 5 with the small signal output impedance of input transistor 1 is made approximately equal to the optimum source impedance for low noise operation of field effect transistor 6. One transistor which is suitable for use as the field effect transistor 6 is the 2N3068 N-channel diffused planar silicon field effect transistor.

As is the practice in direct coupled amplifiers of the type shown in FIG. 1, there is provided a resistance 7 across which the output is developed. The output of the amplifier is connected to the drain of the field effect transistor.

In a field effect transistor circuit, the gate is usually back-biased with respect to the source. A source resistor 8 is provided so that the source may be maintained at a voltage which is positive with respect to the voltage at the gate. Of course, it will be appreciated that various other biasing arrangements may be provided.

To summarize the important characteristics of the invention as illustrated in the FIG. 1 embodiment, the source impedance presented to the input junction transistor 1 is of the optimum magnitude for producing operation of the input transistor 1 in a low noise region. At the same time the collector current through input transistor 1 is maintained at a small value which insures that the transistor operates in the low noise region. In order to provide sufficient gain in the transistor 1, the collector resistor 5 has a high value. The high value of the collector resistor 5 insures that there is sufficient gain at a small collector current. The impedance at the collector of the input transistor 1 is of an optimum magnitude which produces a low noise operation in the field effect transistor 6. The output at the drain of the field effect transistor 6 is of a sufficiently large magnitude that there is no further problem with the introduction of noise and this output can be used to drive a subsequent load having an impedance which may vary over a wide range. Also, the input impedance of the field effect transistor between the gate and the source is sufficiently high that it will not shunt the output of the input transistor 1 thereby adversely affecting the gain of the input transistor 1.

Figure 2:
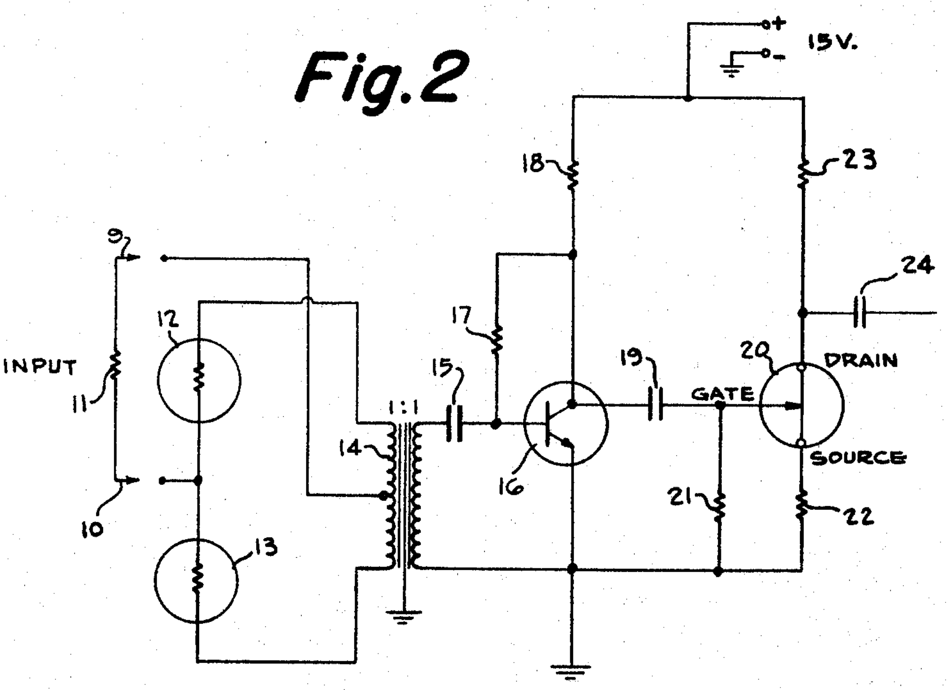
FIG. 2 shows a circuit diagram of an AC amplifier constructed in accordance with the principles of this invention.

One of the alternative embodiments of this invention is shown in FIG. 2 wherein a DC input signal is converted to an AC signal in a chopper type of circuit. This AC signal is applied to an amplifier utilizing the principles of this invention and having all of the desirable characteristics of the circuit of FIG. 1. In the circuit of FIG. 2 an input signal is developed between the two ungrounded terminals 9 and 10. The resistance 11 indicates the impedance of the source of signals. The input signal is converted to an AC signal by the chopper which includes the photoconductive resistors 12 and 13 and the transformer 14. Briefly, in the operation of the chopper, a source of light illuminates the photo-resistors 12 and 13 so that they are rendered alternatively conductive. This results in current flow first through resistor 12 and one-half of the primary of transformer 14 and then current flow through photo-resistor 13 and the other half of the primary of transformer 14. The result is that an AC voltage is developed at the primary of transformer 14 in accordance with the magnitude of the DC input signal. The operation of a chopper amplifier of this type is described more fully in copending application of Polster and Williams, Ser. No. 281,616, filed May 20, 1963.

The transformer 14 is used for the purpose of developing the AC signal. It may have any ratio, for instance, in our specific example, 1:1. The transformer is required to present to the input of transistor 16 approximately the optimum value of source impedance for low noise operation. In FIG. 2 its principal purpose is to provide common mode isolation and signal inversion.

The signal on the secondary of transformer 14 is coupled through coupling capacitor 15 to the base of the input transistor 16. As shown in FIG. 2, a single resistor 17 coupled between the collector and the base is used for biasing purposes.

The collector resistor 18 is connected to the collector of transistor 16. Again, the resistor is chosen to have a high value so that the gain of the input transistor 16 is high even though the collector current through the input transistor 16 is low. The signal appearing at the collector of transistor 16 is coupled through coupling capacitor 19 to the gate of the field effect transistor 20. A biasing resistor 21 is connected between the gate and ground potential and a resistor 22 is connected between the source and ground potential. The resistors 21 and 22 are used to insure that the gate is at a more negative voltage than the source.

The output signal is developed across an output resistor 23 connected to the drain of field effect transistor 20. The output may be coupled through coupling capacitor 24 to any suitable load. Alternatively, it should be pointed out that instead of providing the collector resistor 23 and coupling capacitor 24, an output transformer may be used, in which case the drain would be connected directly to the primary of the output transformer.

Representative component values for the amplifier shown in FIG. 2 are given below. It will be understood that these values are given by away of example only and are not to be considered limiting of the invention.

*Table of values*

| | |
|---|---|
| Coupling capacitor **15** | 5 $\mu f$. |
| Input transistor **16** | 2N930. |
| Single resistor **17** | 12 M. |
| Collector resistor **18** | 560K. |
| Coupling capacitor **19** | .022 $\mu f$. |
| Field effect transistor **20** | 2N3068. |
| Biasing resistor **21** | 4.7 M. |
| Resistor **22** | 470Ω. |
| Output resistor **23** | 68K. |
| Coupling capacitor **24** | .1 $\mu f$. |

While a particular embodiment of the invention has been shown and described, it will, of course, be understood that various modifications may be made without departing from the principles of the invention. For example, other known biasing techniques and other input, interstage and output coupling techniques may be used. The appended claims are, therefore, intended to cover any such modifications within the true spirit and scope of the invention.

What is claimed is:

1. A low noise, small input signal amplifier comprising:

an input junction transistor of the low collector current, high gain type, said input signal being applied to the base of said input transistor, a source impedance connected between the base and emitter of said input transistor, said source impedance having an optimum value for low noise operation of said input transistor, a field effect transistor, the collector of said input transistor being coupled to the gate of said field effect transistor, a source of DC potential, a collector resistor connected between said collector of said input transistor and said source of DC potential, said collector resistor having a resistance substantially equal to the small signal output impedance of said input transistor, and a load coupled to the drain of said field effect transistor.

2. The amplifier recited in claim 1 wherein said collector resistor has a resistance such that the optimum source impedance is presented to said field effect transistor for low noise operation of said field effect transistor.

3. The amplifier recited in claim 1 wherein said input transistor is a planar silicon transistor and said field effect transistor is an N-channel diffused planar silicon field effect transistor.

4. A direct coupled amplifier for small amplitude input signals from a low impedance signal source comprising:

an input junction transistor of the low collector current, high gain type, said signal source being connected to the base of said input transistor, biasing means including an input resistor connected between the base and emitter of said input transistor, said input resistor having a resistance value such that the parallel combination of said input resistor with the impedance of said source substantially equals the optimum source impedance for said input transistor, a field effect transistor, the collector of said input transistor being connected to the gate of said field effect transistor, a source of D.C. potential, a collector resistor connected between said collector of said input transistor and said source of DC potential, said collector resistor having a resistance such that the parallel combination of said collector resistor with the small signal output impedance of said input transistor approximately matches the optimum source impedance for low noise operation of said field effect transistor, and a load resistor connected to the drain of said field effect transistor, the output of said amplifier being connected to said drain of said field effect transistor.

5. An AC amplifier for small amplitude input signals comprising:

an input junction transistor of the low collector current, high gain type, first AC coupling means for applying said input signals to the base of said input transistor, said AC coupling means presenting the optimum source impedance to said input transistor for low noise operation of said input transistor, a field effect transistor, a coupling capacitor connected between the collector of said input transistor and the base of said field effect transistor, a source of D.C. potential, a collector resistor connected between said collector of said input transistor and said source of DC potential, said collector resistor having a resistance such that the parallel combination of said collector resistor with the small signal output impedance of said input transistor approximately matches the optimum source impedance for low noise operation of said field effect transistor, and second AC coupling means connected to the drain of said field effect transistor, the output of said amplifier being connected to the output of said AC coupling means.

References Cited

UNITED STATES PATENTS 3,303,413 2/1967 Warner et al. ----- 307—88.5 X

ROY LAKE, *Primary Examiner.*

L. J. DAHL, *Assistant Examiner.*